United States Patent [19]

Morokawa et al.

[11] 4,346,350

[45] Aug. 24, 1982

[54] FET QUARTZ OSCILLATORS

[75] Inventors: Shigeru Morokawa; Ryoji Iwakura, both of Saitama, Japan

[73] Assignee: Citizen Watch Co., Ltd., Tokyo, Japan

[21] Appl. No.: 116,615

[22] Filed: Jan. 29, 1980

[30] Foreign Application Priority Data

Feb. 16, 1979 [JP] Japan ................................ 54-16981

[51] Int. Cl.$^3$ .............................................. H03B 5/36
[52] U.S. Cl. .......................... 331/116 FE; 331/108 D; 368/159
[58] Field of Search ........ 331/116 R, 116 FE, 108 C, 331/108 D; 368/156, 159, 167

[56] References Cited

U.S. PATENT DOCUMENTS

| | | | |
|---|---|---|---|
| 3,829,795 | 8/1974 | Minney | 331/116 FE |
| 3,887,881 | 6/1975 | Hoffmann | 331/116 FE X |
| 3,956,714 | 5/1976 | Lüscher | 331/116 FE |
| 3,959,744 | 5/1976 | O'Connor | 331/116 FE |

Primary Examiner—Siegfried H. Grimm
Attorney, Agent, or Firm—Bernard, Rothwell & Brown

[57] ABSTRACT

A quartz crystal oscillator for a timepiece including a complementary field effect transistor (FET) pair, wherein one field effect transistor is constant current-biased and the other field effect transistor is self-biased, with high impedance negative feed back loop circuit. The gates of the field effect transistor pair are AC coupled by a condenser, and the drains of the field effect transistor pair are connected to cooperate for AC amplification. The constant current-biased field effect transistor assures a low constant mean current and low start voltage for the oscillator, and the self-biased field effect transistor assures a sure amplifying operation. The AC coupling of the gates assures a high amplification factor and high efficency in excitation of a quartz crystal resonator of an oscillator, whereby the constitution of this invention is simple and easy to form in a monolithic IC chip for a timepiece.

8 Claims, 5 Drawing Figures

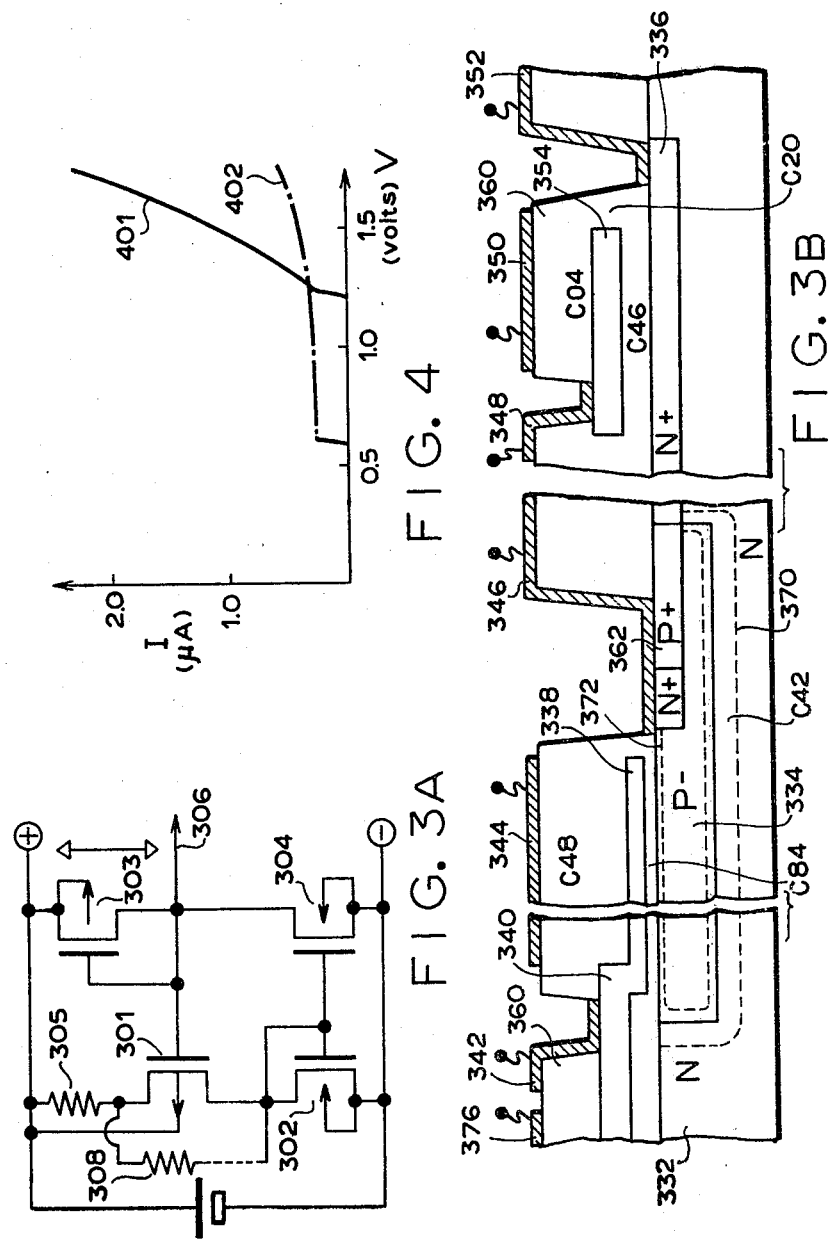

FET QUARTZ OSCILLATORS

BACKGROUND OF THE INVENTION

1. Field of the Invention

This invention relates to oscillator circuits and more particularly to a quartz oscillator circuit which is reliable in operation for a wide voltage range with a reduced power consumption.

2. Description of the Prior Art

Heretofore, it has been the common practice to use an oscillator circuit, particularly a quartz oscillator circuit comprising an inverter circuit composed of a complementary field effect transistor pair (C-FET). Between input and output terminals of the inverter circuit, a high impedance resister is connected for biasing the inverter circuit to an amplifying state. Between the input and output terminals of the inverter circuit on the one hand and the source level on the other hand, condensers are connected so as to constitute a $\pi$ type resonating circuit. The use of such kind of inversion oscillator circuit provides the disadvantage that it is impossible to start the oscillation unless a voltage higher than the sum of absolute values of the threshold voltage of each of the C-FET constituting the inverter circuit is applied thereto, and that a current consumption becomes rapidly increased in proportion to the square of the voltage higher than the threshold voltage.

SUMMARY OF THE INVENTION

An object of the invention, therefore, is to provide an oscillator circuit which can eliminate the drawback which has been encountered with the prior art techniques. That is, this invention provides an oscillator circuit for a timepiece comprising a complementary transistor pair, wherein one transistor is fixedly biased and the other transistor is self-biased, the gates of the transistor pair are AC coupled by a condenser, and the drains of the transistors are connected to co-operate for push-pull AC amplification. The fixed DC biased transistor assures a low constant mean current and low start voltage of the oscillator, and the self-biased transistor assures a sure amplifying operation, AC coupling of the gates assures a high amplification factor and high efficiency in excitation of a quartz crystal resonator of an oscillator. The constitution of this invention is simple and easy to form in a monolithic IC chip for a timepiece. In greater detail, an oscillator circuit of this invention comprises a first reference transistor constituting a simple constant reference voltage supply source, a second transistor DC-biased by a high impedance reference voltage source and a third transistor having a conduction type different from that of the second transistor and connected to each other at the drain electrodes of the second and third transistors, the third FET having a gate and drain connected through a high impedance resistor device with each other.

Another object of the invention is to provide an oscillator circuit composed of first, second and third transistors such as FET which are operative at a substantially constant current in a direct current circuit manner irrespective of the electric supply source voltage or the threshold value of the FET.

A further object of the invention is to provide an oscillator circuit comprising second and third FET coupled in an alternating circuit manner and constituting an inversion amplifier circuit, operative at a constant direct current level, having an optimum operative region irrespective of change in an electric supply source voltage and threshold value and constant in current consumption.

A still further object of the invention is to provide an oscillator circuit comprising a third FET including a negative feed back loop with respect to an output end potential level and hence automatically biased to a high level of an alternating current amplification factor in a manner different from a fixedly biased constant current inverter, and having a high voltage amplification factor and being easily oscillated.

Another object of the invention is to provide an oscillator circuit comprising a first FET operative to start current flow for a voltage higher than a threshold value of the first FET per se and cause second and third FET to flow current therethrough, thereby starting oscillation at a voltage lower than the sum of threshold values of P and N conductivity type FET, that is, at a voltage higher than the threshold value of at least FET at the high threshold value side.

A further object of the invention is to provide an oscillator circuit which can only slightly increase current even when a voltage which permits to start oscillations is applied thereto and which has a significantly improved voltage dependent property of the oscillation frequency.

A feature of the invention is the provision of an oscillator circuit comprising a reference voltage supply source, a first high impedance resistance element connected to the output of the reference voltage supply source, a first transistor connected through the first high impedance resistance element to the reference voltage supply source, a second field effect transistor having a drain connected to the first field effect transistor and having a conduction type which is different from that of the first field effect transistor, a second impedance resistance element forming a negative feed back route coupling between the control gate and drain of the second field effect transistor, a first condenser coupling the control gates of the first and second field effect transistors to couple them and constituting an amplifier circuit to invert a current alternatively, a quartz resonater circuit connected between the control gate of the amplifier circuit and the drain thereof, and an electric supply source connected between the sources of the first and second field effect transistors.

Further objects and features of the invention will be fully understood from the following detailed description with reference to the accompanying drawings, wherein:

BRIEF DESCRIPTION OF THE DRAWINGS

FIG. 3A is a circuit diagram of another embodiment of a reference voltage circuit of an oscillator circuit according to the invention;

FIG. 3B is a diagrammatic cross-sectional view of an embodiment in which respective condensers shown in FIG. 2 are incorporated into a monolithic integrated circuit; and FIG. 4 is a graph showing a voltage-current characteristic of an oscillator circuit according to the invention and that of a conventional oscillator circuit.

PREFERRED EMBODIMENT OF THE INVENTION

Figure 1:
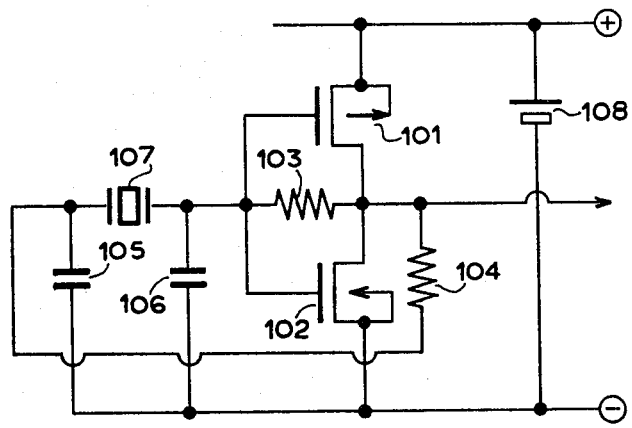
FIG. 1 is a circuit diagram of a conventional oscillator circuit which makes use of a C-FET.

FIG. 1 shows a conventional quartz oscillator circuit. In FIG. 1, reference numeral 101 designates a P-channel FET to which is connected a N-channel FET 102 having a different conductivity type. These FET 101 and 102 constitute an inverter. Between the gate and the drain electrodes of these FET 101 and 102 is connected a bias resistor 103 in parallel therewith. To the output side of the bias resistor 103 is connected an output resistor 104. Between the bias resistor 103 and the output resistor 104 is connected a quartz vibrator 107. To the input and output ends of the quartz vibrator 107 are connected an input condenser 106 and an output condenser 105 to form a $\pi$ type resonating circuit, respectively. In FIG. 1, reference numeral 108 designates an electric supply battery.

That electric supply voltage which exceeds the sum of absolute values of respective threshold values of the FET 101 and 102 causes a current to pass through the drains of the FET 101, 102 in proportion to the square of the voltage increment. As a result, when the battery voltage is high enough to oscillate the circuit, there occurs a significantly large useless current which flows through FET 101 and 102 bypassing the resonater circuit.

Figure 2:
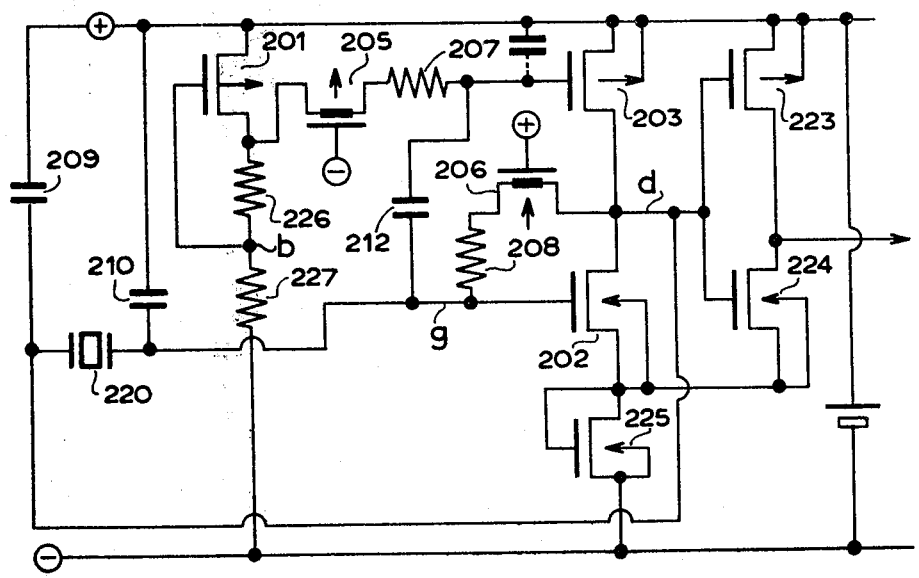
FIG. 2 is a circuit diagram of one embodiment of an oscillator circuit according to the invention.

FIG. 2 shows one embodiment of an oscillator circuit according to the invention. In FIG. 2, reference numeral 220 designates a quartz vibrator. To the input and output sides of the quartz vibrator 220 are connected resonator condensers 209, 210 to form a resonator circut employing quartz vibrator 220, respectively. In FIG. 2, reference numeral 200 designates an electric supply source battery having a $\oplus$ side connected to a P-channel FET 201 and a $\ominus$ side connected to bias voltage dividing polysilicon high impedance resistors or impurity difused island resistors 226, 227. The gate of the P-channel FET 201 is connected to a node point b between the high impedance resistors 226, 227. The FET 201 and resistors 226, 227 constitute a constant reference voltage source. To the node between the FET 201 and the resistor 226 is connected a P-channel MOS non-linear resistor 205 having a gate connected to the ground. The P-channel MOS resistor 205 is connected through a polysilicon high impedance resistor 207 to the gate of a P-channel FET 203.

Between the quartz vibrator 220 on the one hand and the node between the high impedance resistor 207 and the gate of the FET 203 on the other hand is connected a condenser 212 for alternating current coupling the gate of the FET 203 to the gate of the FET 202. Between the node between the quartz vibrator and the drain of the N-channel FET 202 on the one hand and the oscillation condenser 209 on the other hand is connected through a N-channel MOS resistor 206 a polysilicon high impedance resistor 208. Between the N-channel FET 202 and the $\ominus$ side of the electric supply source battery 200 is connected a voltage drop transistor 225. In FIG. 2, reference numerals 223 and 224 designate FET for constituting wave form shaping inverters, respectively.

In the oscillator circuit constructed and arranged as above described, the voltage between the drain and the source of the FET 201 is maintained at its substantially threshold value and operative to bias the gate of the FET 203 through a high impedance resistor composed of the FET high impedance resistor 205 and the polysilicon high resistor 207 connected in series with each other. For example, if the mutual conductance of the P-channel FET 201 is equal to 1/10 of the mutual conductance of the P-channel FET 203 and if a current of 30 nA flows through the P-channel FET 201 and the resistors 226, 227, a current mirror operation allows a current of 300 nA to flow through the P-channel FET 203 and causes a current of 300 nA to flow through the N-channel FET 202. This current level is not substantially changed even when the electric supply source voltage is changed. The N-channel FET 202 and the P-channel FET 203 are coupled with each other through the alternating coupling condenser 212 and hence constitute a complementary type pushpull inversion amplifier having a high amplification factor with respect to the alternating current component signal and low bypassing current, thereby exciting the quartz vibrator 220. Let the threshold value of the P-channel FET 201, 203 and N-channel FET 202 be 0.5 volt, then the oscillator circuit becomes oscillated at an electric supply voltage of nearly equal to or higher than 0.5 volt.

FIG. 3A shows another embodiment of a voltage reference transistor circuit shown in FIG. 2. In FIG. 3A, reference numeral 300 designates an electric supply source battery. The voltage reference transistor circuit is composed of P-channel FET 301, 303, N-channel FET 302, 304, a diffusion resistor 305 and a high impedance resistor 308, and functions to deliver from its output terminal 306 a voltage substantially equal to the threshold value of the P-channel FET 303. The operation of the circuit shown in FIG. 3A will now be described.

In FIG. 3A, if the P-channel FET 301 is under a current flow condition or resistor 308 leaks a small current, both the drain potential and the gate potential of the N-channel FET 302 are raised up. If the gate potential of the N-channel FET 302 tends to exceed its threshold value $V_{TN}$, it becomes conductive, and as a result, the potential difference between the drain potential and the source potential thereof is restricted to a value of the order of its threshold value $V_{TN}$. To the N-channel FET 302 and 304 are applied the same gate voltage, so that the current mirror operation is effected to limit the drain potential of the P-channel FET 303 and hence the potential difference between the source potential and the drain potential thereof is restricted to a value of the order of its threshold value $V_{TPR}$. This threshold value $V_{TPR}$ is applied to the P-channel FET 301 which then takes a constant current operation in which the drain current is not influenced by the source-drain voltage and causes a constant current to flow therethrough. As a result, under a balanced state, the potential difference between the drain potential and the source potential of the N-channel FET 302 and P-channel FET 303 becomes constant irrespective of the electric supply source voltage. But, this condition is satisfied on the assumption that the P-channel FET 301 is conductive. For example, if the drain-source of the P-channel FET 303 is subjected to the load connected to $\oplus$ and hence the P-channel FET 301 is not conductive, each of the N-channel FET 302, 304 and P-channel FET 303 become OFF. In order to prevent such operation, it is necessary to make the channel width of the P-channel FET 301 larger than those of the other FET so as to utilize the conductive sub-threshold region up to a low gate voltage, or connect high impedance resistor 308. That is, it is necessary to cause the P-channel FET 301 to flow an extremely minute current therethrough.

In the above mentioned combination of the reference voltage source and the inversion amplifier circuit, in order to make the mutual relation between the threshold voltage and the mutual conductance of the P and N type field effect transistors constant, it is effective to incorporate these transistors into a monolithic integrated circuit formed on the same integrated circuit chip. In addition, in view of making a profit on mass production scale by constituting circuit blocks for timepieces with least possible number of circuit elements, it is extremely effective to incorporate the coupling condenser 212, polysilicone resistance element 338 (FIG. 3B) which small stray capacitance as the high resistance element and FET non-linear resistance element into a monolithic integrated circuit formed on the same integrated circuit chip. Such kind of the monolithic oscillator circuit according to the invention is exactly the same as the conventional oscillator circuit in symbolic circuit appearance, but has the advantage that it can oscillate at a stable frequency and greatly reduced current consumption contrary to the conventional integrated oscillator circuit.

FIG. 3B shows an embodiment of a monolithic integrated circuit including the alternating current coupling condenser 212 and oscillation condensers 209, 210 incorporated therein. In FIG. 3B, reference numeral 332 designates a semiconductor substrate formed, for example, of silicon Si or gallium arsenic GaAs. In the present embodiment, the semiconductor substrate 332 is a N type silicon substrate. The semiconductor substrate 332 provided therein with a P-well region 334 for forming an N-channel FET, a high impurity concentration region 362 for forming an ohmic contact of the P-well region 334 and an N type region 336 having an impurity concentration which is higher than that of the semiconductor substrate 332 and for forming a contact thereof. Between the N type substrate 332 and the P type region 334 is formed a depletion layer 370 as shown by dotted lines.

In FIG. 3B, reference numeral 360 designates an insulating layer formed of thermally treated silicon oxide or chemically deposited silicon oxide. On the insulating layer 360 are formed conductive wiring portions 342, 344, 346, 348, 350 and 352 each formed of metal or semiconductor. In the present embodiment, these wiring portions are formed of aluminum. The insulating layer 360 is provided therein with other wiring portions 340, 354 partly connected to the above mentioned wiring portions and formed of polysilicon doped with a high concentration impurity. The wiring portion 340 is provided with a conductive polysilicone wiring portion 338 used as a gate electrode of the FET.

The aluminum electrode portion 344 and the polysilicon electrode portion 338 constitute a condenser $C_{48}$ therebetween. The polysilicon electrode portion 338 and the P-well region 334 constitute a condenser $C_{84}$ therebetween. The P-well region 334 and the semiconductor substrate 332 constitute a condenser $C_{42}$ therebetween. In addition, the semiconductor substrate 332 and the aluminum wiring portion 350 constitute a condenser $C_{20}$. Moreover, the aluminum electrode portion 350 and the polysilicon electrode portion 354 constitute a condenser $C_{04}$ therebetween. The polysilicon electrode portion 354 and the high impurity concentrated region 336 constitute a condenser $C_{46}$ therebetween. Among these condensers, the condenser $C_{42}$ is of P-N junction capacity and hence has a large capacity value per unit area. As a result, the condenser $C_{42}$ tends to induce a junction leak current and discharge the electric charge accumulated on the condenser. In addition, the depletion layer 370 changes its thickness and changes its capacity as the direct current bias voltage applied across the P-well region 334 and the semiconductor substrate 332 changes. That is, the condenser $C_{42}$ is of one having a voltage dependent characteristic.

The condenser $C_{84}$ is composed of a thin insulating layer, in the present embodiment, a thermally oxidized $SiO_2$ layer sandwiched between the polysilicon electrode portion 338 and the P-well region 334 and has merits that a capacity value per unit area is large and comparable with that of the condenser $C_{42}$ and that no leakage current flow occurs between the electrodes 338 and 334. In the condenser $C_{84}$, however, the semiconductor band structure on the surface of the P-well region 334 becomes bent in response to the applied voltage so as to produce the depletion layer 372 or eliminate it. In addition, a thin N type channel layer is formed on the P-well region 334 which is relatively small in impurity concentration, so that the condenser $C_{84}$ has a voltage dependent characteristic. Moreover, the condenser $C_{84}$ has a high series resistance because of low conductivity of P-well or thin channel electrode of the P-well region 334. If the P-well region 344 is ion-implanted with P-type impurity at a high concentration as P+ region, substantially depletion layer 372 is not induced, electric conductivity becomes high, the voltage dependent property is improved and the series resistance becomes low.

The condenser $C_{48}$ has no leak between the electrodes and no voltage dependent property, but has a small capacity value per unit area which is about 1/10 times smaller than that of the condenser $C_{84}$.

The condenser $C_{04}$ is the same as the condenser $C_{84}$, but has a capacity per unit area which is larger than that of the condenser $C_{48}$ and smaller than that of the condenser $C_{84}$.

The condenser $C_{46}$ has a property which is the same as that of the condenser $C_{84}$ which is subjected to implantation with an impurity having a high concentration, but is small in capacitance value per unit area.

A capacitance formed between the polysilicon electrode portion 340 and the aluminum electrode portion 376 can be used as a condenser $C_{06}$ which has the same property as that of the condenser $C_{04}$.

In order to incorporate the coupling condenser 212 shown in FIG. 2 into an integrated circuit chip of a small size, it is preferable to use the condenser $C_{84}$ or $C_{42}$. If use is made of the condenser $C_{84}$, the P-well region 334 is connected to the gate of the FET and the polysilicon electrode portion 338 is connected to the gate of the FET 202. In this case, the condenser $C_{42}$ is parasitically produced. That is, the condenser $C_{42}$ is considered to constitute a part of the resonance condenser 210 shown in FIG. 2. When the polysilicon electrode portion 338 is connected to the gate of the P-channel FET 201 and the P-well region 334 is connected to the gate of the N-channel FET 202, the parasitic capacity $C_{42}$ is connected through the condenser $C_{84}$ to a part of the resonance condenser 210. The resonance condenser 210 has to be stable enough to keep stable resonating frequency and to have small series resistance.

In the present embodiment, if it is the most important to reduce the leak between the electrodes and voltage dependent property, use may be made of the condensers $C_{04}$ and $C_{46}$. If the condenser $C_{04}$ is used as the alternating current coupling condenser 212, the condenser $C_{46}$ is parasitically produced as a parasitic capacity. The condenser $C_{46}$ may be incorporated into the resonance condenser 210. The role of the condenser $C_{04}$ may be reversed to that of the condenser $C_{46}$. That is, the condenser $C_{46}$ may be used as the alternating current coupling condenser 212 and the condenser $C_{04}$ may be considered as the parasitic capacity.

The integrated circuit construction and arrangement of the condensers shown in FIG. 3B constitute an effective monolithic integrated circuit of these condensers. The use of such composite condenser construction provides the important advantage that the parasitic capacity which has always been induced when condensers are incorporated into an integrated circuit is incorporated into a resonance capacity.

In addition, it is effective to use an ion implantation for the purpose of making the impurity concentration of the semiconductor substrate for constituting the condenser electrode high.

The capacity $C_{04}$ formed between the aluminum electrode portion 350 and the polysilicon electrode portion 354 and requiring a large area has heretofore not been used often. The use of such capacity $C_{04}$, however, ensures a decrease of the leakage current between the condenser electrodes and provides the important advantage that the voltage dependence can be eliminated. In addition, the capacity $C_{04}$ can effectively be used as a condenser having a low series resistance and a high quality factor. Moreover, the use of the capacity $C_{04}$ in a quartz resonance circuit having a high resonance quality factor (Q factor) ensures excellent characteristics of stability and low energy consumption.

In addition, the condenser $C_{04}$ or $C_{46}$ may be used as the resonance condensers 209, 210 shown in FIG. 2 and all of the circuit elements exclusive of the quartz, for example, a resistor, condenser and FET may be incorporated into the same monolithic integrated circuit chip.

FIG. 4 shows the voltage-current characteristic of the oscillator circuit according to the invention and that of the conventional oscillator circuit. In FIG. 4, reference numeral 401 designates a full line curve showing the current consumption of the conventional oscillator circuit and 402 dot-dashed curve showing the current consumption of the oscillator circuit according to the invention.

As stated hereinbefore, the invention is capable of providing a quartz oscillator circuit which can reduce power consumption, which is highly stable in operation, which has a wide operative marginal voltage and which is effective in practice. In addition, the quartz oscillator circuit according to the invention may be used as a time reference signal supply source for timepieces with power consumption reduced.

The conception of this invention is not only restricted to field effect transistor circuit, but also adaptable to bipolar transistor integrated circuits. In such a case, the term of "gate," "drain" and "source" of a field effect transistor can be replaced by the term "base," "collector" and "emitter" of a bipolar transistor, respectively.

What is claimed is:

1. An oscillator circuit comprising
   (a) a reference voltage supply source;
   (b) a first high resistance element connected to the output of said reference voltage supply source;
   (c) a first transistor having a first drain electrode and a control gate electrode, said control gate electrode being connected through said first high resistance element to said reference voltage supply source;
   (d) a second transistor having a second control gate electrode and a second drain electrode, said second drain electrode connected to said drain electrode of said first transistor and having a conduction type different from that of said first transistor;
   (e) a second high resistance element connected between said second control gate electrode and the drain electrode of said second transistor;
   (f) a first condenser coupling the control gate electrodes of said first and second transistors such that said first and second transistors form an inversion amplifier circuit;
   (g) a quartz resonator circuit connected between the second control gate electrode of said inversion amplifier circuit and the first drain electrode thereof; and
   (h) an electric supply source connected between a third electrode of said first and second transistors.

2. The oscillator circuit according to claim 1, wherein at least one of said first and second high resistance elements is composed of a field effect transistor.

3. The oscillator circuit according to claim 1, wherein said reference voltage supply source is composed of a third transistor having a source electrode and a drain electrode whose potential difference is operative to deliver an output, said source electrode of said third transistor being connected through a third resistor element to one side of said electric supply source, said drain electrode of said third transistor being connected to the other side of said electric supply source, and said third transistor having a third control gate electrode connected to a midpoint of said third resistor element.

4. The oscillator circuit according to claim 1, wherein each of said first and second high resistance elements is composed of a polysilicon resistor and a field effect transistor resistor connected in series with each other.

5. The oscillator circuit according to claim 1, wherein said reference voltage supply source, said first and second high resistance elements, said first condenser and said first and second transistors are incorporated into the same monolithic integrated circuit chip.

6. The oscillator circuit according to claim 5, wherein one of the electrodes of said first condenser is formed of metal and the other electrode is formed of polysilicon having a high impurity concentration.

7. The oscillator circuit according to claim 5, wherein one of the electrodes of said first condenser is formed of polysilicon having a high impurity concentration and the other electrode is formed of a semiconductor substrate whose impurity concentration is made high by ion implantation.

8. The oscillator circuit according to claim 5, wherein said first condenser incorporated into the same integrated circuit chip is composed of a composite condenser including three conductive electrodes and two insulating layers interposed between said three conductive electrodes, said composite condenser being operative as an alternating current coupling between the control gate electrodes of said first and second transistors and also as a resonance capacity of a resonance circuit.

* * * * *